United States Patent [19]
McCleary

[11] Patent Number: 5,166,530
[45] Date of Patent: Nov. 24, 1992

[54] ILLUMINATOR FOR MICROLITHOGRAPHIC INTEGRATED CIRCUIT MANUFACTURE

[75] Inventor: Roger W. McCleary, Salem, N.H.

[73] Assignee: General Signal Corporation, Stamford, Conn.

[21] Appl. No.: 811,820

[22] Filed: Dec. 20, 1991

[51] Int. Cl.$^5$ .............................................. H01K 1/26
[52] U.S. Cl. .............................. 250/492.2; 250/493.1; 250/504 R
[58] Field of Search ............... 250/492.2, 492.1, 493.1, 250/503.1, 504 R

[56] References Cited

U.S. PATENT DOCUMENTS 4,591,724  5/1986  Fuse et al. .................. 250/504 R
5,097,136  3/1992  Meyer et al. ................. 250/492.1

OTHER PUBLICATIONS

Rick Hamilton "Volatile Organic Compound Destruction Using Thermal Processing" *Solid State Technology*, Sep. 1991—pp. 51-53.

Primary Examiner—Jack I. Berman
Assistant Examiner—Kiet T. Nguyen
Attorney, Agent, or Firm—Henry D. Pahl, Jr.

[57] ABSTRACT

The illuminator apparatus disclosed herein provides illumination for the microlithographic manufacture of semiconductor integrated circuits. Degradation of the illuminator output by photopolymerization of volatile compounds associated with the resist coatings is inhibited by utilizing a composite filter at the cooling area inlet to the light source which includes a bed of activated carbon for removing volatile compounds which are photopolymerizable to substances which are absorbtive at the exposing wavelengths.

10 Claims, 2 Drawing Sheets

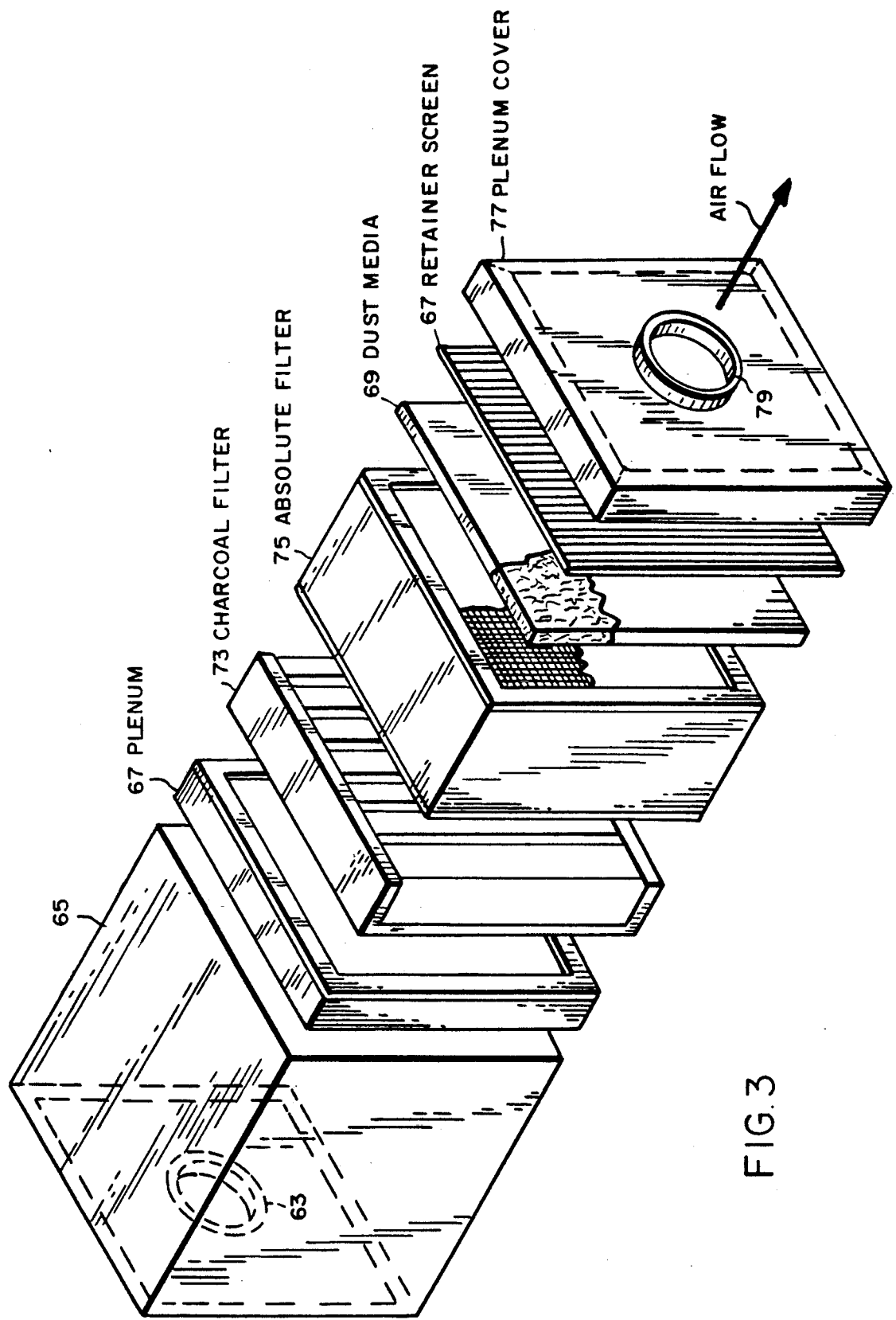

ILLUMINATOR FOR MICROLITHOGRAPHIC INTEGRATED CIRCUIT MANUFACTURE

BACKGROUND OF THE INVENTION

The present invention relates to an illuminator apparatus for the microlithographic manufacture of semiconductor integrated circuits and more particularly to illuminator apparatus which is operable at wavelengths of about 365 nanometers or less and which is protected against degradation by photopolymerization of volatile compounds associated with the lithographic resists.

As is understood by those skilled in the art, high density integrated circuits are typically manufactured by microlithographic techniques in which a semiconductor wafer coated with a photosensitive resist is exposed stepwise in a step-and-repeat projection system. At each step, an image of a mask or reticle is optically reduced and projected on the resist coated surface using light of a wavelength suitable for exposing the resist. To obtain improved resolution, the projection optics have been designed to utilize progressively shorter wavelengths as light sources and resists are developed. Currently, step-and-repeat systems are turning to the so-called i-line generated by high pressure mercury lamps. The i-line comprises wavelengths of about 365 nanometers as compared with the previously utilized g-line at 436 nanometers. As i-line step-and-repeat systems have been introduced into fab lines, however, they have suffered rapid deterioration in the output of the illuminator system. In accordance with one aspect of the present invention, it has been discovered that such degradation has not been caused by deterioration of the lamps or the optics associated with the lamps but rather has, in large part, been caused by the photopolymerization of volatile compounds associated with the resist materials and the depositing of the products of the photopolymerization on the surfaces of the optics. While photopolymerization of such volatile compounds has probably occurred previously to varying extents, it was generally unrecognized and did not create a significant problem. In accordance with another aspect of the present invention, it has been discovered that typical reaction products of the photopolymerization process described above are highly absorbtive at 365 nanometers but are relatively transmissive at only slightly longer wavelengths. In accordance with another aspect of the invention, it has been found that the offending volatile compounds can be removed from the cooling air stream supplied to the illuminator by passing it over a bed of activated carbon particles. A particulate filter downstream from the activated carbon bed prevents particulates from being drawn into the illuminator system.

Among the several objects of the present invention may be noted the provision of novel illuminator apparatus for the microlithographic manufacture of semiconductor integrated circuits; the provision of such illuminator apparatus which is operable at wavelengths of about 365 nanometers or less; the provision of such apparatus which utilizes a high pressure mercury arc lamp as a light source; the provision of such illuminator apparatus which does not experience degradation of the optical elements associated with the light source; the provision of such illuminator apparatus which provides highly uniform illumination; the provision of such apparatus which is highly reliable and which is of relatively simple and inexpensive manufacture. Other objects and features will be in part apparent and in part pointed out hereinafter.

SUMMARY OF THE INVENTION

The illuminator apparatus of the present invention is useful in the microlithographic manufacture of semiconductor integrated circuits by exposure of a resist coated wafer at wavelengths of about 365 nanometers or less. A high pressure mercury arc lamp emits light at a variety of wavelengths. A light collection means such as an elliptical reflector collects light emitted from the lamp and directs it into the entrance of an optical filter means for removing at least wavelengths longer than about 365 nanometers. A housing encloses the lamp, the collection means and at least the entrance of the optical filter means and provides an inlet and an outlet for cooling air. A composite filter is connected to the inlet and includes a bed of activated carbon for removing, from air drawn into the housing, volatile compounds which are photopolymerizable into substances which are absorbtive at wavelengths of about 365 nanometers or less. The composite filter includes also a particulate filter between the bed and the inlet. Accordingly, degradation of light output from the illuminator apparatus by the photopolymerization of volatile compounds is inhibited.

BRIEF DESCRIPTION OF THE DRAWINGS

FIG. 3 is an exploded view of a composite filter assembly employed in the illuminator apparatus of FIG. 2.

Corresponding reference characters indicate corresponding parts throughout the several views of the drawings.

DESCRIPTION OF THE PREFERRED EMBODIMENT

Figure 1:
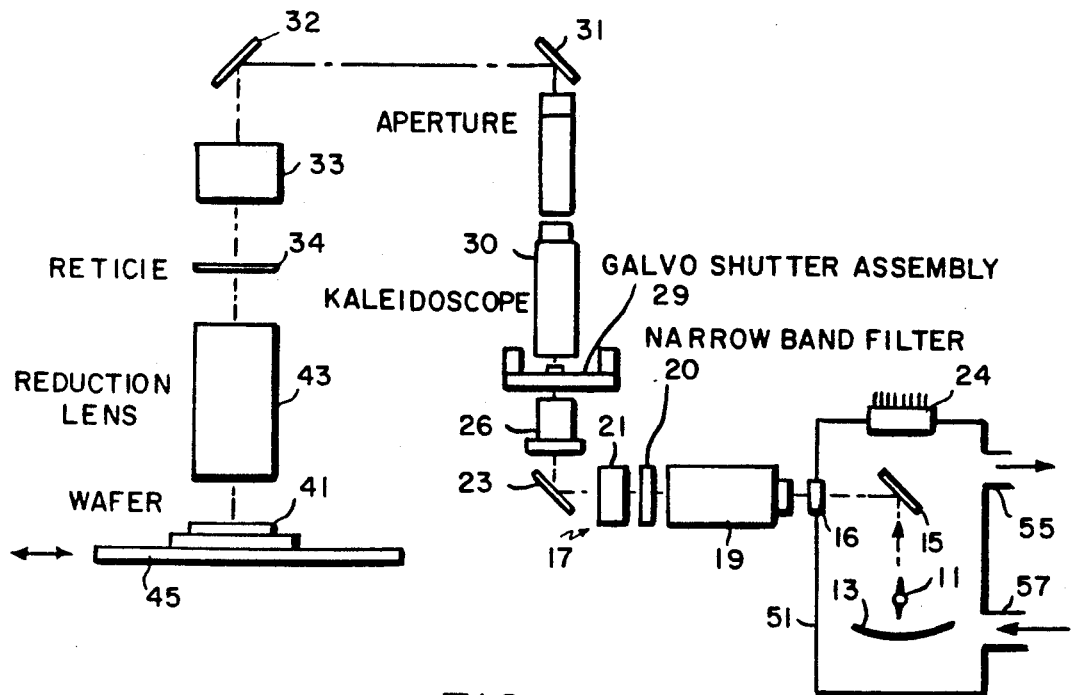
FIG. 1 is a diagrammatic illustration of a microlithographic projector for integrated circuit manufacture utilizing illuminator apparatus in accordance with the present invention.

Referring now to FIG. 1, a high pressure mercury arc lamp is indicated by reference character 11. As is understood, lamp 11 emits light at a variety of wavelengths and must be cooled by a continuous flow of air. The lamp is positioned so that the arc is located essentially at one focus of an elliptical reflector 13 which collects the light given off by the lamp. Light collected by the elliptical reflector 13 is directed, by way of a cold mirror 15, through a window 16 which constitutes the entrance of a succession of filters, designated collectively by reference character 17. The cold mirror 15 transmits wavelengths above 500 nanometers to a heat sink 24 while reflecting only shorter wavelengths into the optical projector system. Heat sink 24 is provided with a cooling flow of air as described in greater detail hereinafter.

The reflector 13 is focused at a first lens cell 19. Mounted on lens cell 19 are filters which block g-line and deep ultraviolet (DUV) radiation. The light then passes through a narrow band filter 20 which isolates the i-line. This selected light is collected by a lens group 21 and is reflected off a mirror 23.

The light reflected by mirror 23 is directed by a further lens group 26 through a shutter assembly 29 into a kaleidoscope assembly 30. The shutter assembly 29 is operated in coordination with the step-and-repeat mechanism for determining exposure at each position on the wafer. The kaleidoscope assembly 30 effects a spatial averaging of the light intensity. The light path is turned by additional mirrors 31 and 32 to reach a condenser lens 33. Condenser lens 33 directs the light through a reticle 34 which contains the pattern to be projected. An image of the reticle is projected onto a resist coated wafer 41 by a high resolution reduction lens 43. The wafer 41 is carried on an x-y stage 45 so that different regions or sites on the wafer can be brought into the field of the projection lens 43 for successive exposures.

Figure 2:
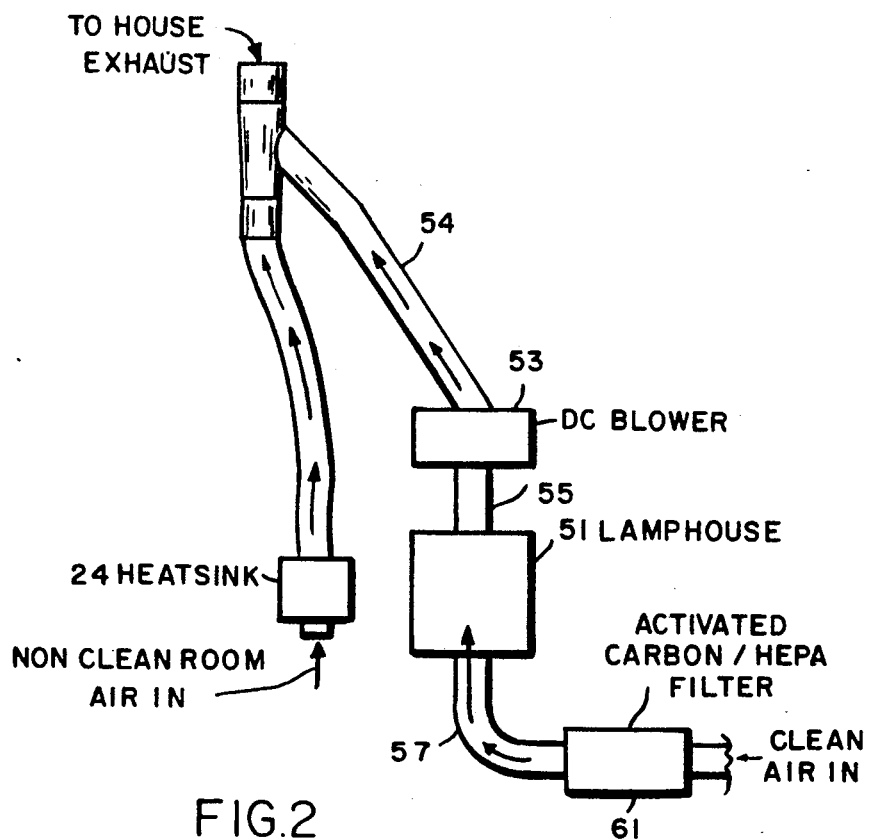
FIG. 2 is a diagrammatic illustration of cooling air ductwork and a composite filter employed in the apparatus of FIG. 1.

The lamp 11, elliptical reflector 13, mirror 15 and window 16 are enclosed in a housing 51. As indicated previously, lamp 11 requires a continuous flow of cooling air. This cooling air is drawn through housing 51 by a blower 53 which is connected to an air outlet 55 in the housing as illustrated in FIG. 2. Air is admitted to the housing through an inlet 57. The air drawn by the blower 53 is directed, through suitable ducting 54, to the house exhaust which is typically provided at semiconductor fab facilities. The house exhaust system is also employed to draw cooling air past the heat sink 24 which is associated with the cold mirror 15. Preferably, air from outside the fab line clean room is ducted in to the heat sink to avoid draining the highly filtered fab line air.

Although the environmental air in a semiconductor fab line is heavily filtered, this filtering is directed at extracting particulate matter which could produce flaws in the image projected on the wafer or, if deposited on the reticle, could be reproduced on the wafer. This conventional filtering does not to any substantial extent remove volatile or gaseous compounds and many such compounds are present in a semiconductor fab line environment. In accordance with one aspect of the present invention, it has been discovered that hexamethyldisilazine (HMDS) is commonly used to improve the adhesion of resists employed in semiconductor integrated circuit manufacture and that the photopolymerization products of HMDS included silicon dioxide which is highly absorbtive at wavelength of 365 nanometers though it is highly transmissive at wavelengths which are only slightly longer and is almost transparent for visible light so that the presence of coatings of this material was not previously noticeable.

In accordance with one aspect of the present invention, it has been found that most volatile photopolymerizable compounds and particularly HMDS can be removed from an air stream by passing the air stream through a bed of activated carbon, e.g. activated charcoal. In the apparatus of FIGS. 1 and 2, a composite filter 61 including an activated carbon bed is attached to the cooling air inlet 57 to the illuminator housing 51.

The construction of the composite filter 61 is illustrated in greater detail in FIG. 3. Air enters through an opening 63 in a housing assembly 65. A frame 67 creates an entrance plenum space and various filtering elements are assembled into the enclosure after the frame. A bed of activated carbon is provided as indicated by reference character 73 and this is followed by a HEPA or so-called absolute filter 75 which blocks any particles shed by the activated carbon bed. In the commercially available filter illustrated, a retainer screen 67 and a coarse dust extracting media 69 are incorporated but do not provide a significant function in the system of the present invention. The filter assembly is completed by a cover 77 which provides an exit plenum space and an outlet connector 79. The particular composite filter assembly shown in FIG. 3 is available from the Barneby & Sutcliffe Company of Columbus, Ohio as its Model QDF.

In view of the foregoing it may be seen that several objects of the present invention are achieved and other advantageous results have been attained.

As various changes could be made in the above constructions without departing from the scope of the invention, it should be understood that all matter contained in the above description or shown in the accompanying drawings shall be interpreted as illustrative and not in a limiting sense.

What is claimed is:

1. Illuminator apparatus for the microlithographic manufacture of semiconductor integrated circuits by exposure of a resist coated wafer at wavelengths of about 365 nanometers or less, said apparatus comprising:

a lamp which emits light at a variety of wavelengths;
optical filter means having an entrance and an exit and being operative to remove at least wavelengths longer than about 365 nanometers from light applied to said entrance;
means for directing light emitted from said lamp into the entrance of said optical filter means;
housing means enclosing said lamp and at least the entrance of said optical filter means, said housing means providing an inlet and an outlet for cooling air for said lamp; and
connected to said inlet, a filter which includes a bed of activated carbon for removing from air passing through said housing volatile compounds which are photopolymerizable, whereby degradation of light output from said illuminator apparatus by the photopolymerization of volatile compounds is inhibited.

2. Apparatus as set forth in claim 1 wherein said lamp is a mercury arc lamp.

3. Apparatus as set forth in claim 1 wherein said light directing means is a focussed reflector.

4. Apparatus as set forth in claim 3 wherein said reflector is elliptical and said lamp is at one of the elliptical facii.

5. Apparatus as set forth in claim 1 including a blower connected to said outlet for drawing air through said housing.

6. Illuminator apparatus for the microlithographic manufacture of semiconductor integrated circuits by exposure of a resist coated wafer at wavelengths of about 365 nanometers or less, said apparatus comprising:

a high pressure mercury arc lamp which emits light at a variety of wavelengths;
optical filter means having an entrance and an exit and being operative to remove at least wavelengths longer than about 365 nanometers from light applied to said entrance;
light collection means for collecting light emitted from said lamp and directing the collected light into the entrance of said optical filter means;
housing means enclosing said lamp, said collection means and at least the entrance of said optical filter means, said housing means providing an inlet and an outlet for cooling air for said lamp;
blower means for drawing air from said outlet; and
connected to said inlet, a filter which includes a bed of activated carbon for removing from air drawn into said housing volatile compounds which are photopolymerizable into substances which are absorbtive at wavelengths of about 365 nanometers or less, whereby degradation of light output from said illuminator apparatus by the photopolymerization of volatile compounds is inhibited.

7. Apparatus as set forth in claim 6 wherein said collecting means is an elliptical reflector.

8. Apparatus as set forth in claim 6 wherein said filter is a composite filter including a particulate filter between said activated carbon bed and said inlet.

9. Apparatus as set forth in claim 6 wherein said optical filter means includes a cold mirror which traps heat producing wavelengths and is coupled to an air cooled heat sink.

10. Illuminator apparatus for the microlithographic manufacture of semiconductor integrated circuits by exposure of resist coated wafer at wavelengths of about 365 nanometers or less, said apparatus comprising:

a high pressure mercury arc lamp which emits light at a variety of wavelengths;

optical filter means having an entrance and an exit and being operative to remove at least wavelengths longer than about 365 nanometers from light applied to said entrance, said optical filter means including a cold mirror which traps heat producing wavelengths and is coupled to an air cooled heat sink;

an elliptical reflector for collecting light emitted from said lamp and directing the collected light into the entrance of said optical filter means;

housing means enclosing said lamp, said collection means and at least the entrance of said optical filter means, said housing means providing an inlet and an outlet for cooling air for said lamp;

blower means for drawing air from said outlet;

connected to said inlet, a composite filter which includes a bed of activated carbon for removing from air drawn into said housing volatile compounds which are photopolymerizable into substances which are absorbtive at wavelengths of about 36 nanometers or less, said composite filter including also a particulate filter between said bed and said inlet, thereby to inhibit degradation of light output from said illuminator apparatus by the photopolymerization of volatile compounds; and duct means for connecting air drawn by said blower and air passing over said heat sink to a house exhaust.

* * * * *

UNITED STATES PATENT AND TRADEMARK OFFICE
CERTIFICATE OF CORRECTION

PATENT NO. : 5,166,530
DATED : November 24, 1992
INVENTOR(S) : Roger W. McCleary It is certified that error appears in the above-identified patent and that said Letters Patent is hereby corrected as shown below:

Claim 10, Column 5, line 18, after "of" (first occurrence) but before "resist", insert --a--; and in Column 6, at the end of line 16, "36 nanometers" should be --365 nanometers--.

Signed and Sealed this

Ninth Day of August, 1994

Attest:

BRUCE LEHMAN

Attesting Officer

Commissioner of Patents and Trademarks